(12) United States Patent
Guha et al.

(10) Patent No.: US 12,057,491 B2
(45) Date of Patent: Aug. 6, 2024

(54) SELF-ALIGNED GATE ENDCAP (SAGE) ARCHITECTURES WITH GATE-ALL-AROUND DEVICES ABOVE INSULATOR SUBSTRATES

(71) Applicant: Intel Corporation, Santa Clara, CA (US)

(72) Inventors: Biswajeet Guha, Hillsboro, OR (US);
Dax M. Crum, Beaverton, OR (US);
Stephen M. Cea, Hillsboro, OR (US);
Leonard P. Guler, Hillsboro, OR (US);
Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1122 days.

(21) Appl. No.: 16/239,090

(22) Filed: Jan. 3, 2019

(65) Prior Publication Data

US 2020/0219990 A1    Jul. 9, 2020

(51) Int. Cl.
*H01L 27/12* (2006.01)
*H01L 21/28* (2006.01)
(Continued)

(52) U.S. Cl.
CPC .... *H01L 29/6653* (2013.01); *H01L 21/28114* (2013.01); *H01L 21/28123* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 9,881,998 B1 * 1/2018 Cheng ............... H01L 21/02565
9,911,736 B1    3/2018 Zang et al.
(Continued)

FOREIGN PATENT DOCUMENTS

WO    WO 2018004680        1/2018
WO    WO-2018004680 A1 *   1/2018    ....... H01L 21/76895

OTHER PUBLICATIONS

Office Action from European Patent Application No. 19199150.4, mailed Jan. 5, 2022, 7 pages.
(Continued)

*Primary Examiner* — Younes Boulghassoul
(74) *Attorney, Agent, or Firm* — Schwabe, Williamson & Wyatt, P.C.

(57) ABSTRACT

Self-aligned gate endcap (SAGE) architectures with gate-all-around devices above insulator substrates, and methods of fabricating self-aligned gate endcap (SAGE) architectures with gate-all-around devices above insulator substrates, are described. In an example, an integrated circuit structure includes a semiconductor nanowire above an insulator substrate and having a length in a first direction. A gate structure is around the semiconductor nanowire, the gate structure having a first end opposite a second end in a second direction, orthogonal to the first direction. A pair of gate endcap isolation structures is included. The first of the pair of gate endcap isolation structures is directly adjacent to the first end of the gate structure, and the second of the pair of gate endcap isolation structures is directly adjacent to the second end of the gate structure.

9 Claims, 12 Drawing Sheets

(51) Int. Cl.
  *H01L 21/762*    (2006.01)
  *H01L 21/8234*   (2006.01)
  *H01L 21/84*     (2006.01)
  *H01L 29/06*     (2006.01)
  *H01L 29/423*    (2006.01)
  *H01L 29/66*     (2006.01)
  *H01L 29/78*     (2006.01)
  *H01L 29/786*    (2006.01)

(52) U.S. Cl.
  CPC .......... *H01L 21/76224* (2013.01); *H01L 21/823437* (2013.01); *H01L 21/823481* (2013.01); *H01L 21/845* (2013.01); *H01L 27/1211* (2013.01); *H01L 29/4238* (2013.01); *H01L 29/66545* (2013.01); *H01L 29/66772* (2013.01); *H01L 29/66795* (2013.01); *H01L 29/78654* (2013.01); *H01L 29/78696* (2013.01); *H01L 29/0673* (2013.01); *H01L 29/42392* (2013.01); *H01L 29/7853* (2013.01)

(58) Field of Classification Search
  CPC .......... H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 29/0649; H01L 29/0653; H01L 29/6681; H01L 21/823481; H01L 21/823878; H01L 21/76224; H01L 21/76229; H01L 21/76232; H01L 29/66545; H01L 29/42376; H01L 29/4238; H01L 29/42384; H01L 21/28114; H01L 21/823437; H01L 21/823828; H01L 21/823456; H01L 21/82385; H01L 21/28123

See application file for complete search history.

(56) References Cited

U.S. PATENT DOCUMENTS

| | | | |
|---|---|---|---|
| 10,510,620 B1* | 12/2019 | Chanemougame | ......................... H01L 29/66439 |
| 10,607,896 B2* | 3/2020 | Ragnarsson | .... H01L 21/823871 |
| 2010/0252800 A1* | 10/2010 | Chidambarrao | .... H01L 29/0665 977/762 |
| 2012/0138886 A1 | 6/2012 | Kuhn | |
| 2014/0084342 A1* | 3/2014 | Cappellani | ........ H01L 29/78696 257/E21.409 |
| 2016/0233298 A1* | 8/2016 | Webb | ................... H01L 29/785 |
| 2017/0330801 A1* | 11/2017 | Ragnarsson | .... H01L 21/823871 |
| 2018/0033871 A1* | 2/2018 | Xie | ................. H01L 21/02532 |
| 2018/0047808 A1 | 2/2018 | Webb | |
| 2019/0214469 A1* | 7/2019 | Paul | ................. H01L 29/78654 |
| 2019/0237360 A1* | 8/2019 | Reznicek | .......... H01L 29/66439 |
| 2020/0105604 A1* | 4/2020 | Lin | ................... H01L 21/26586 |
| 2020/0105752 A1* | 4/2020 | Liaw | ..................... B82Y 10/00 |
| 2020/0119004 A1* | 4/2020 | Ching | ............. H01L 29/42392 |
| 2020/0135580 A1* | 4/2020 | Hsieh | ............. H01L 21/823431 |
| 2020/0135740 A1* | 4/2020 | Liaw | ..................... B82Y 10/00 |
| 2020/0168715 A1* | 5/2020 | Wu | ................ H01L 21/823412 |

OTHER PUBLICATIONS

Search Report from European Patent Application No. 19199150.4, mailed Mar. 25, 2020, 10 pages.

* cited by examiner

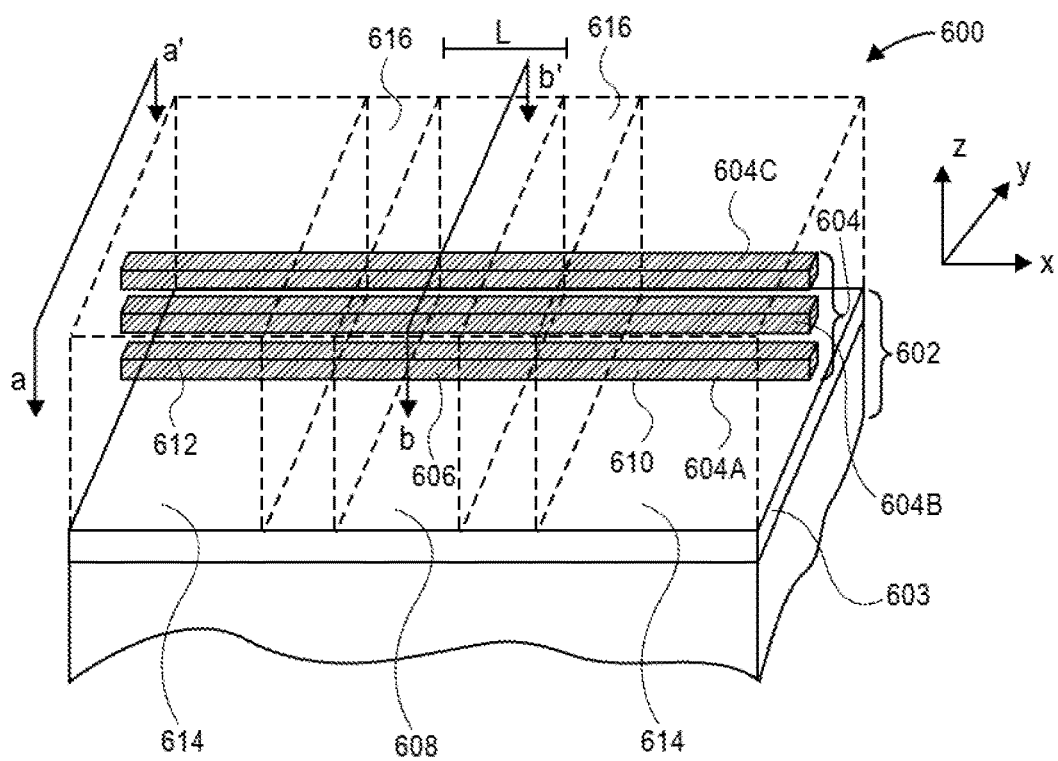
FIG. 6A
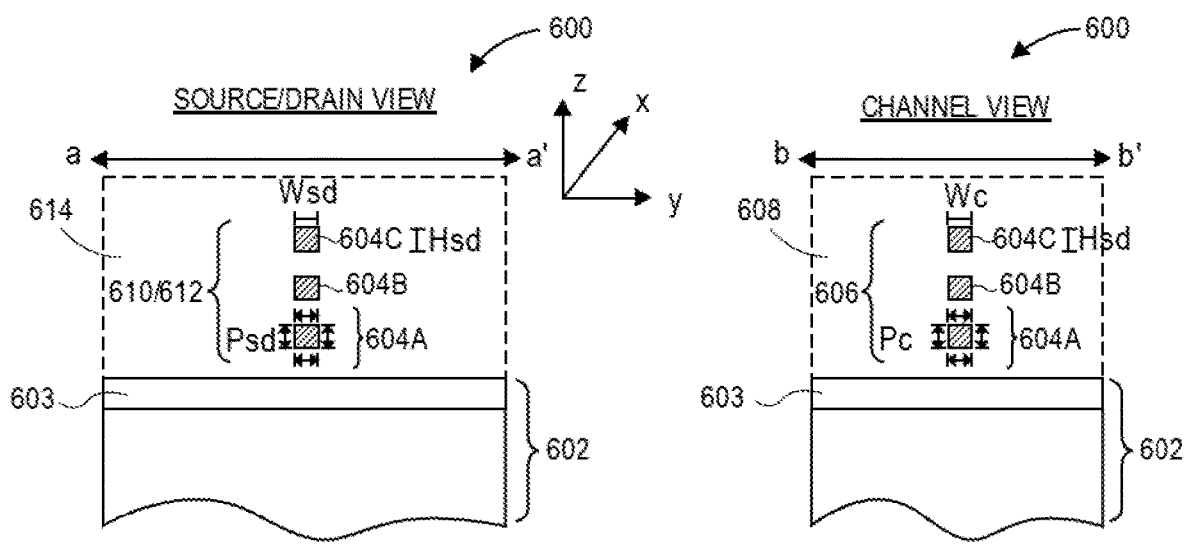
FIG. 6B  FIG. 6C

SELF-ALIGNED GATE ENDCAP (SAGE) ARCHITECTURES WITH GATE-ALL-AROUND DEVICES ABOVE INSULATOR SUBSTRATES

TECHNICAL FIELD

Embodiments of the disclosure are in the field of semiconductor devices and processing and, in particular, self-aligned gate endcap (SAGE) architectures with gate-all-around devices above insulator substrates, and methods of fabricating self-aligned gate endcap (SAGE) architectures with gate-all-around devices above insulator substrates.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIG. 6A illustrates a three-dimensional cross-sectional view of a nanowire-based semiconductor structure, in accordance with an embodiment of the present disclosure.

FIG. 6B illustrates a cross-sectional source or drain view of the nanowire-based semiconductor structure of FIG. 6A, as taken along the a-a' axis, in accordance with an embodiment of the present disclosure.

FIG. 6C illustrates a cross-sectional channel view of the nanowire-based semiconductor structure of FIG. 6A, as taken along the b-b' axis, in accordance with an embodiment of the present disclosure.

DESCRIPTION OF THE EMBODIMENTS

Figure 1:
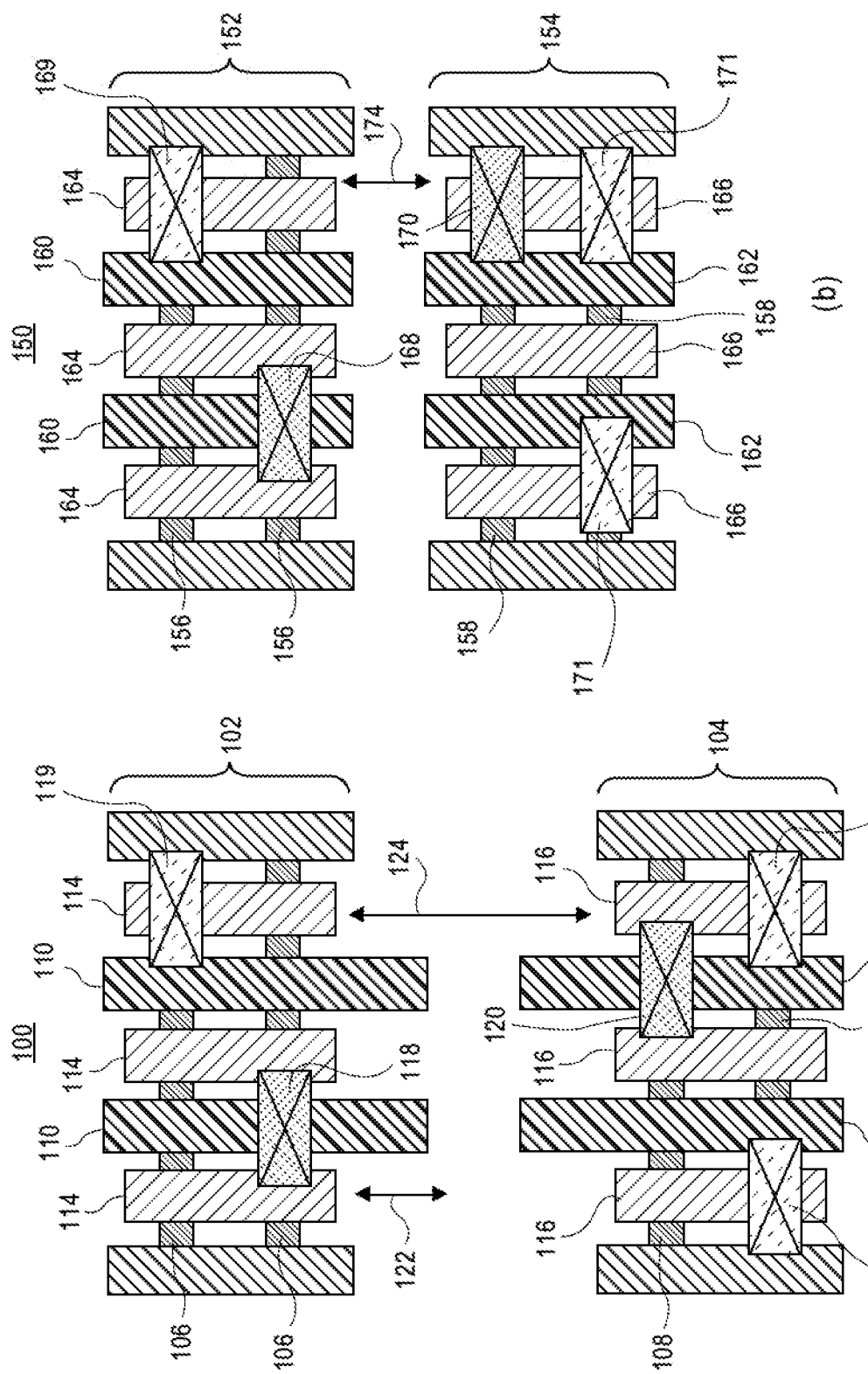
FIG. 1 illustrates plan views of adjacent integrated circuit structures for a conventional architecture with relatively wide spacing (left-hand side) versus adjacent integrated circuit structures for a self-aligned gate endcap (SAGE) architecture with relatively tight spacing (right-hand side), in accordance with an embodiment of the present disclosure.

Self-aligned gate endcap (SAGE) architectures with gate-all-around devices above insulator substrates, and methods of fabricating self-aligned gate endcap (SAGE) architectures with gate-all-around devices above insulator substrates, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments of the present disclosure are directed to semiconductor structures or devices having one or more gate endcap structures (e.g., as gate isolation regions) of gate electrodes of the semiconductor structures or devices. Additionally, methods of fabricating gate endcap isolation structures in a self-aligned manner (self-aligned gate endcap, of SAGE) are also described. In one or more embodiments, self-aligned gate endcap structures are fabricated with gate-all-around features above an insulator substrate. Embodiments described herein may address issues associated with scaling diffusion end-to-end spacing in an ultra-scaled process technology.

In accordance with one or more embodiments of the present disclosure, approaches described herein involve the fabrication of a precursor nanowire forming and associated SAGE walls on an insulating substrate, followed by multiple width (multi-Wsi) fin patterning. In one embodiment, SAGE wall fabrication is performed subsequent to fin patterning. In one embodiment, a SAGE spacer etch is performed to fabricate an opening to anchor a SAGE wall to a buried oxide layer of an insulator substrate. In an embodiment, a silicon height (HSi) recesses is not needed since HSi is self-aligned to the buried oxide level.

In one embodiment, the insulator substrate begins as a silicon germanium on insulator (SiGeOI) substrate, e.g., formed using a layer transfer approach, where the SiGe layer is ultimately used as a lowermost release layer in a nanowire release fabrication scheme. In another embodiment, the insulator substrate begins as a silicon on insulator (SiOI) substrate, wherein the overlying silicon layer is initially thinned and a SiGe or GE layer is formed thereon. In one such embodiment, an anneal drives Ge into the thinned silicon layer to form a bottommost SiGe release layer.

Particular embodiments may be directed to CMOS integration of multiple width (multi-Wsi) nanowires and nanoribbons in a SAGE architecture above an insulator substrate. In an embodiment, NMOS and PMOS nanowires/nanoribbons are integrated with multiple Wsi in a SAGE architecture based front end process flow above an insulator substrate. Such a process flow may involve integration of nanowires and nanoribbons of different Wsi to provide robust functionality of next generation transistors with low power and high performance.

To provide context, state-of-the-art approaches have relied on lithographic scaling of the gate end to end (poly cut) to define a minimum technology gate overlap of diffusion. The minimum technology gate overlap of diffusion is a key component in diffusion end to end space. An associated gate line (poly cut) process has typically been limited by lithography, registration, and etch bias considerations, and ultimately sets the minimum diffusion end to end distance. Other approaches such as contact over active gate (COAG) architectures have worked to improve such diffusion spacing capability. However, improvements in this technology arena remain highly sought after.

Advantages of a self-aligned gate endcap (SAGE) architecture over conventional approaches may include the enabling of higher layout density and, in particular, scaling of diffusion to diffusion spacing. As an example, FIG. 1 illustrates plan views of adjacent integrated circuit structures for a conventional architecture with relatively wide spacing (left-hand side) versus adjacent integrated circuit structures for a SAGE architecture with relatively tight spacing (right-hand side), in accordance with an embodiment of the present disclosure.

Referring to the left-hand side of FIG. 1, a layout 100 includes first 102 and second 104 integrated circuit structures based on semiconductor nanowires 106 and 108, respectively. Each device 102 and 104 has a gate electrode 110 or 112, respectively. Additionally, each device 102 and 104 has trench contacts (TCNs) 114 or 116, respectively, at source and drain regions of the nanowires 106 and 108, respectively. Gate vias 118 and 120, and trench contact vias 119 and 121 are also depicted.

Referring again to the left-hand side of FIG. 1, the gate electrodes 110 and 112 have a relatively wide end cap region 122, which is located off of the corresponding nanowires 106 and 108, respectively. The TCNs 114 and 116 each have a relatively large end-to-end spacing 124, which is also located off of the corresponding nanowires 106 and 108, respectively.

By contrast, referring to the right-hand side of FIG. 1, in an embodiment, a layout 150 includes first 152 and second 154 integrated circuit structures based on semiconductor nanowires 156 and 158, respectively. Each device 152 and 154 has a gate electrode 160 or 162, respectively. Additionally, each device 152 and 154 has trench contacts (TCNs) 164 or 166, respectively, at source and drain regions of the nanowires 156 and 158, respectively. Gate vias 168 and 170, and trench contact vias 169 and 171 are also depicted.

Referring again to the right-hand side of FIG. 1, the gate electrodes 160 and 162 have a relatively tight end cap region, which is located off of the corresponding nanowires

156 and 158, respectively. The TCNs 164 and 166 each have a relatively tight end-to-end spacing 174, which is also located off of the corresponding nanowires 156 and 158, respectively.

To provide further context, scaling of gate endcap and trench contact (TCN) endcap regions are important contributors towards improving transistor layout area and density. Gate and TCN endcap regions refer to gate and TCN overlap of the diffusion region/nanowire of semiconductor devices. As an example, FIG. 2 illustrates a plan view of a conventional layout 200 including nanowire-based semiconductor devices accommodating end-to-end spacing.

Figure 2:
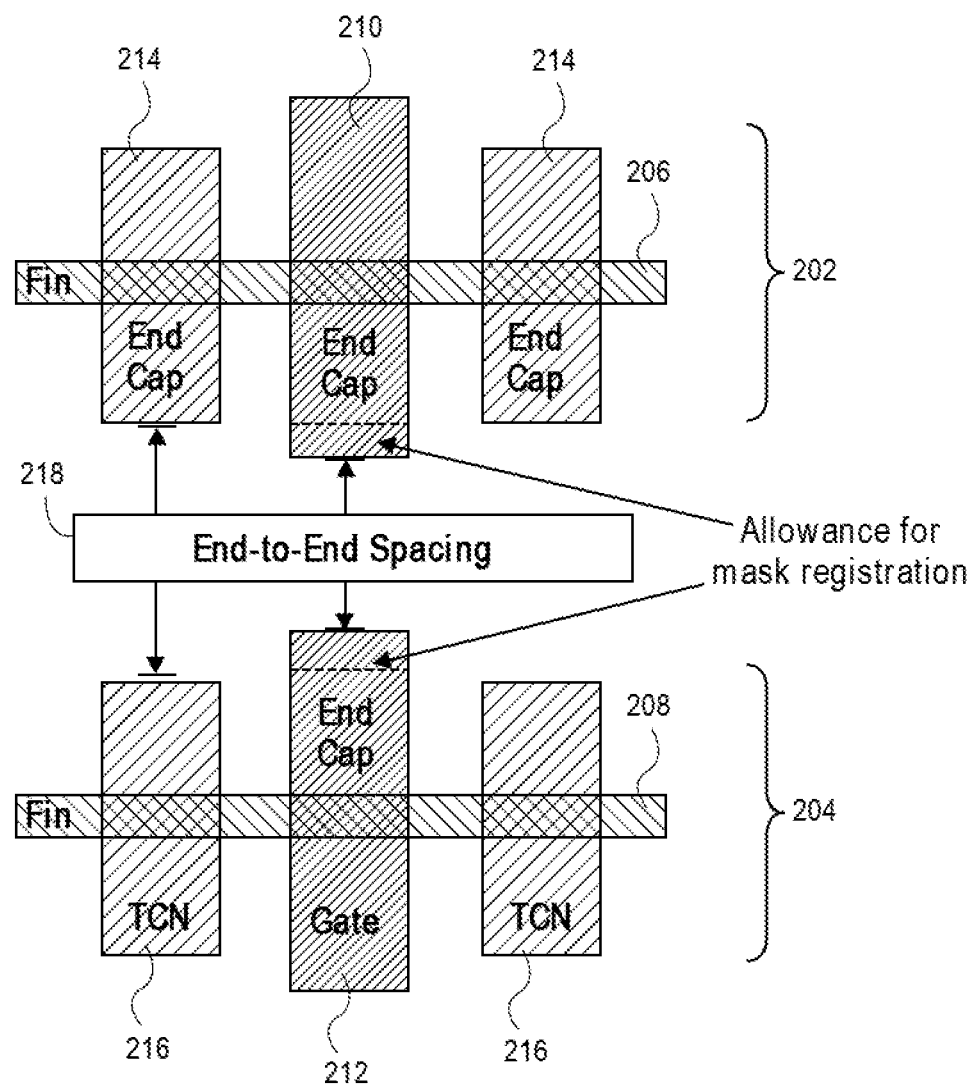
FIG. 2 illustrates a plan view of a conventional layout including nanowire-based semiconductor devices accommodating end-to-end spacing.

Referring to FIG. 2, first 202 and second 204 semiconductor devices are based on semiconductor nanowires 206 and 208, respectively. Each device 202 and 204 has a gate electrode 210 or 212, respectively. Additionally, each device 202 and 204 has trench contacts (TCNs) 214 or 216, respectively, at source and drain regions of the nanowires 206 and 208, respectively. The gate electrodes 210 and 212 and the TCNs 214 and 216 each have an end cap region, which is located off of the corresponding nanowires 206 and 208, respectively.

Referring again to FIG. 2, typically, gate and TCN endcap dimensions must include an allowance for mask registration error to ensure robust transistor operation for worst case mask mis-registration, leaving an end-to-end spacing 218. Thus, another important design rule critical to improving transistor layout density is the spacing between two adjacent endcaps facing each other. However, the parameters of "2*Endcap+End-to-End Spacing" are becoming increasingly difficult to scale using lithographic patterning to meet the scaling requirements for new technologies. In particular, the additional endcap length required to allow for mask registration error also increases gate capacitance values due to longer overlap length between TCN and gate electrodes, thereby increasing product dynamic energy consumption and degrading performance. Previous solutions have focused on improving registration budget and patterning or resolution improvements to enable shrinkage of both endcap dimension and endcap-to-endcap spacing.

In accordance with an embodiment of the present disclosure, approaches are described which provide for self-aligned gate endcap and TCN overlap of a semiconductor nanowire without any need to allow for mask registration. In one such embodiment, a disposable spacer is fabricated on sidewalls of a starting semiconductor fin (which includes one or more nanowire forming layers) which determines the gate endcap and the contact overlap dimensions. The spacer-defined endcap process enables the gate and TCN endcap regions to be self-aligned to the starting semiconductor fin and, therefore, does not require extra endcap length to account for mask mis-registration. Furthermore, approaches described herein do not necessarily require lithographic patterning at previously required stages since the gate and TCN endcap/overlap dimensions remain fixed, leading to improvement (i.e., reduction) in device to device variability in electrical parameters.

In accordance with one or more embodiments of the present disclosure, scaling is achieved through a reduction of gate endcap overlap to diffusion by constructing a SAGE wall. As an example, FIG. 3 illustrates cross-sectional views taken through nanowires for a conventional architecture (left-hand side) versus a self-aligned gate endcap (SAGE) architecture (right-hand side), in accordance with an embodiment of the present disclosure.

Figure 3:
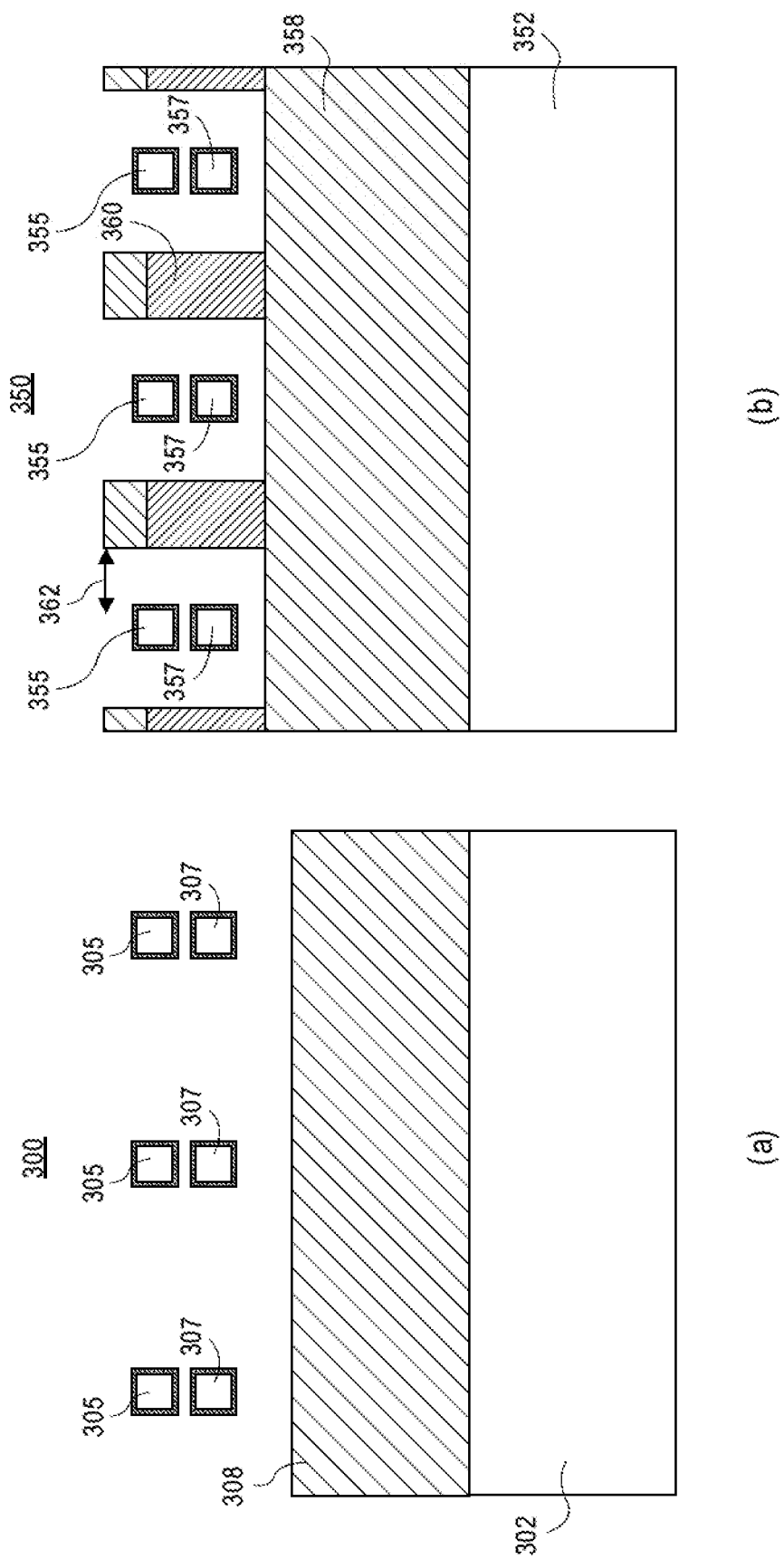
FIG. 3 illustrates cross-sectional views taken through nanowires for a conventional architecture (left-hand side) versus a self-aligned gate endcap (SAGE) architecture (right-hand side), in accordance with an embodiment of the present disclosure.

Referring to the left-hand side of FIG. 3, an integrated circuit structure 300 includes an insulator substrate having a lower semiconductor portion 302 and an upper insulator portion 308. Stacks of nanowires 305/307 are above the upper insulator portion 308. A gate structure may ultimately be formed over the integrated circuit structure 300 to fabricate a device. However, breaks in such a gate structure are accommodated for by increasing the spacing between nanowire 305/307 stacks.

By contrast, referring to the right-hand side of FIG. 3, an integrated circuit structure 350 includes an insulator substrate having a lower semiconductor portion 352 and an upper insulator portion 358. Stacks of nanowires 355/357 are above the upper insulator portion 358. Isolating SAGE walls 360 (which may include a hardmask thereon, as depicted) are included between nanowire 355/357 stacks. The distance between an isolating SAGE wall 360 and a nearest nanowire 355/357 stack defines the gate endcap spacing 362. A gate structure may be formed over the integrated circuit structure 300, between insolating SAGE walls to fabricate a device. Breaks in such a gate structure are imposed by the isolating SAGE walls. Since the isolating SAGE walls 360 are self-aligned, restrictions from conventional approaches can be minimized to enable more aggressive diffusion to diffusion spacing. Furthermore, since gate structures include breaks at all locations, individual gate structure portions may be layer connected by local interconnects formed over the isolating SAGE walls 360. In an embodiment, as depicted, the SAGE walls 360 each include a lower dielectric portion and a dielectric cap on the lower dielectric portion.

In accordance with one or more embodiments of the present disclosure, a self-aligned gate endcap (SAGE) processing scheme involves the formation of gate/trench contact endcaps self-aligned to nanowires without requiring an extra length to account for mask mis-registration. Thus, embodiments may be implemented to enable shrinking of transistor layout area. Embodiments described herein may involve the fabrication of gate endcap isolation structures, which may also be referred to as gate walls, isolation gate walls or self-aligned gate endcap (SAGE) walls.

In an embodiment, a SAGE architecture is implemented by fabricating a SAGE isolation structure after a process of cutting the nanowires (which may be in the form of a starting fin structure) to remove nanowire portions in select locations. In another embodiment, SAGE wall formation is performed prior to the finalization of nanowire geometries. For comparative purposes, FIG. 4 illustrates cross-sectional views and corresponding plan views of integrated circuit structures fabricated (a) without a SAGE isolation structure, (b) with a SAGE isolation structure fabricated after a wire cut process, and (c) with a SAGE isolation structure fabricated before a wire cut process, in accordance with an embodiment of the present disclosure.

Figure 4:
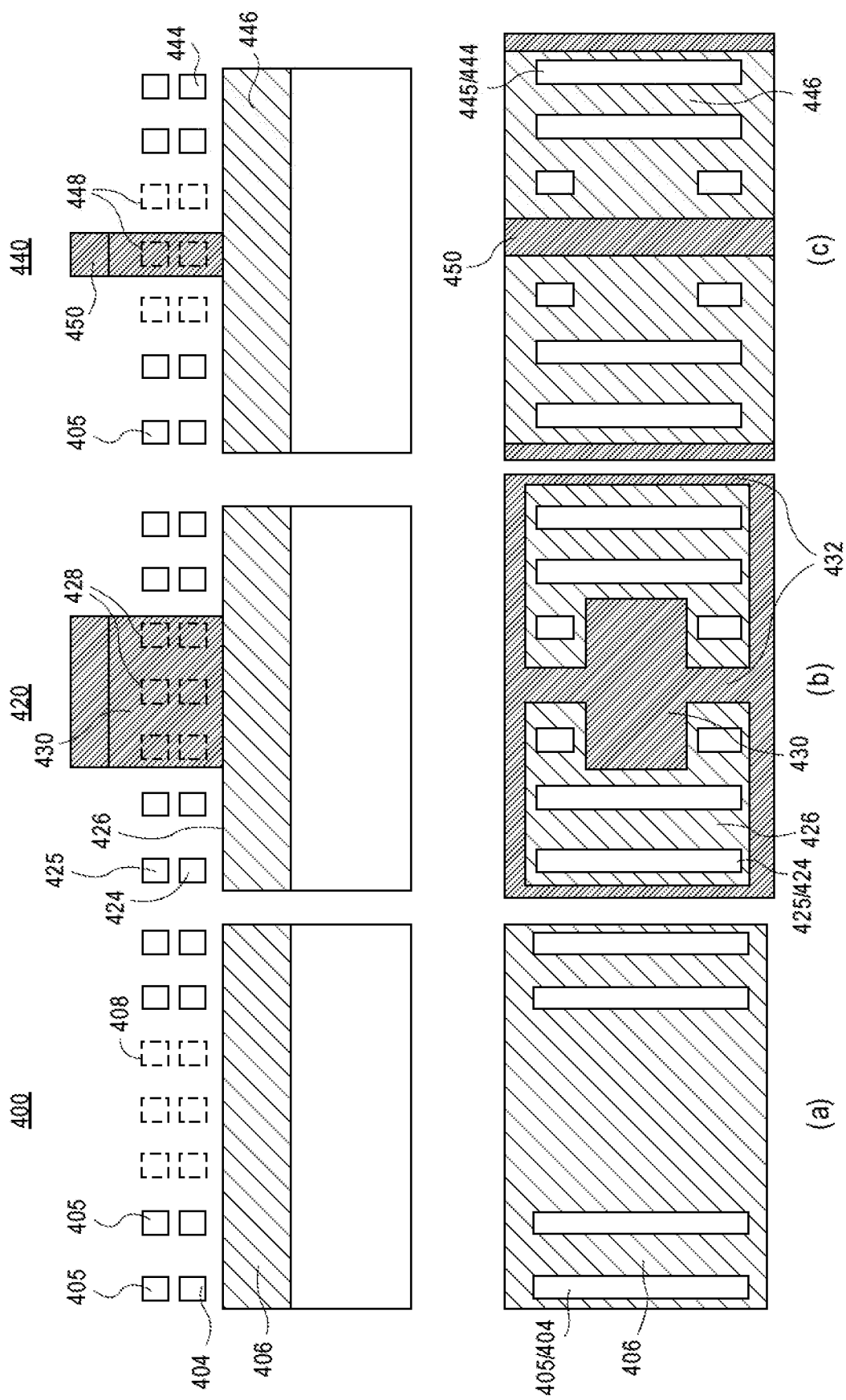
FIG. 4 illustrates cross-sectional views and corresponding plan views of integrated circuit structures fabricated (a) without a SAGE isolation structure, (b) with a SAGE isolation structure fabricated after a wire cut process, and (c) with a SAGE isolation structure fabricated before a wire cut process, in accordance with an embodiment of the present disclosure.

Referring to part (a) of FIG. 4, an integrated circuit structure 400 fabricated without a SAGE isolation structure includes a substrate having a plurality of nanowire stacks 404/405 over an insulator portion 406 of the substrate. Locations 408 indicate regions where nanowires or portions of nanowires have been removed, e.g., by a masking and etch process.

Referring to part (b) of FIG. 4, an integrated circuit structure 420 fabricated by forming a SAGE isolation structure after a wire cut process, which is referred to herein as a bi-directional SAGE architecture, includes a substrate having a plurality of nanowire stacks 424/425 over an insulator portion 426 of the substrate. Locations 428 indicate regions where nanowires or portions of nanowires are removed, e.g., by a masking and etch process. A SAGE wall 430 (which may include a hardmask as indicated by the horizontal line) is formed in locations 428 and has extension portions 432 extending from the SAGE wall 430.

Referring to part (c) of FIG. 4, an integrated circuit structure 440 fabricated by forming a SAGE isolation structure prior to a wire cut process, which is referred to herein as a unidirectional SAGE architecture, includes a substrate having a plurality of nanowire stacks 444/445 over an insulator portion 446 of the substrate. Locations 448 indicate regions where nanowires or portions of nanowires are removed or are not formed. A SAGE wall 450 (which may include a hardmask as indicated by the horizontal line) is formed in a narrow region of location 428. In contrast, to the SAGE wall 430 of part (b) of FIG. 4, the SAGE wall 450 has a same width adjacent non-cut nanowire portions as the width adjacent a nanowire cut portion.

Referring to integrated structure 440, as compared to integrated circuit structure 420, by relocating the wall formation prior to starting fin/nanowire precursor cuts, the SAGE wall can be restricted to running along the nanowire direction only. Referring to the plan view (lower portion) of part (c) of FIG. 4, in accordance with an embodiment of the present disclosure, an integrated circuit structure includes a first semiconductor nanowire stack (nanowire pair 444/445 to immediate left of 450) having a cut along a length of the first semiconductor nanowire stack. A second semiconductor nanowire stack (nanowire stack 444/445 to immediate right of 450) has a cut along a length of the second semiconductor nanowire stack. A gate endcap isolation structure 450 is between the first semiconductor nanowire stack and the second semiconductor nanowire stack. The gate endcap isolation structure 450 has a substantially uniform width along the lengths of the first and second semiconductor nanowire stacks.

Figure 5A:
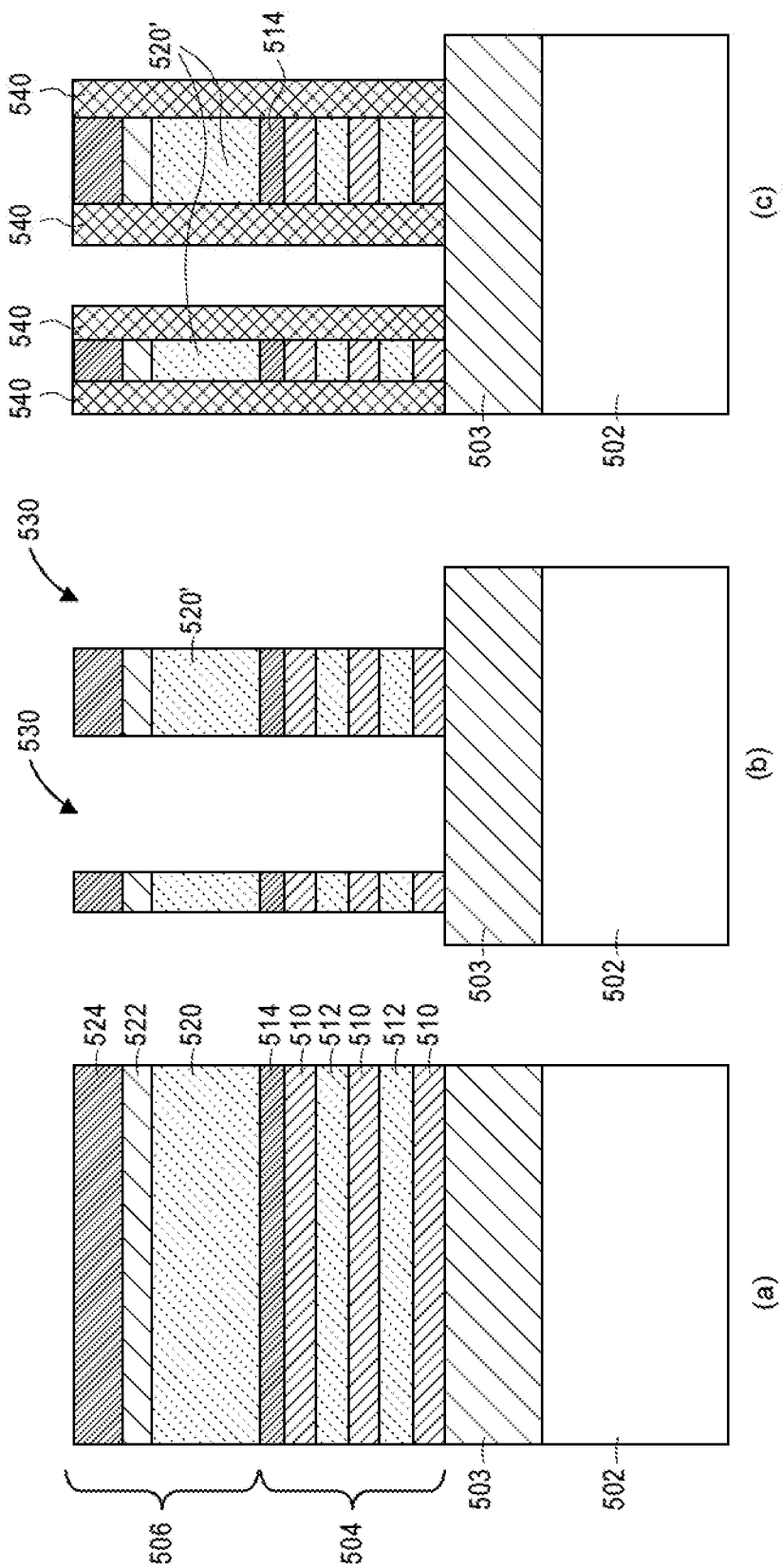
FIGS. 5A and 5B illustrate cross-sectional views representing various operations in a method of fabricating a self-aligned gate endcap (SAGE) structure with gate-all-around devices above an insulator substrate, in accordance with an embodiment of the present disclosure.
Figure 5B:
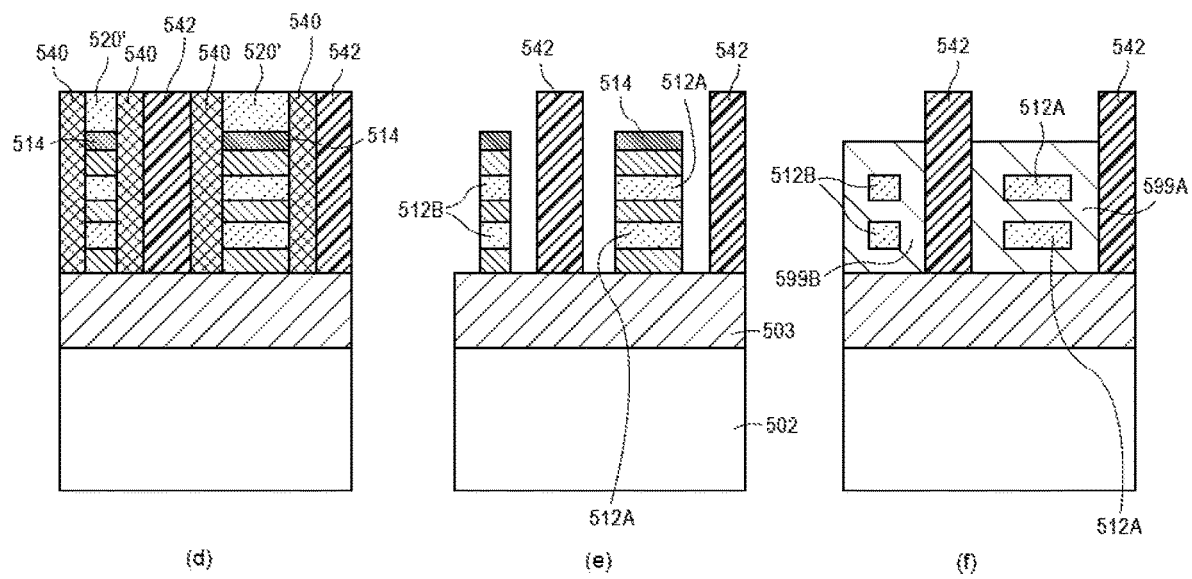

In an exemplary processing scheme, FIGS. 5A and 5B illustrate cross-sectional views representing various operations in a method of fabricating a self-aligned gate endcap (SAGE) structure with gate-all-around devices above an insulator substrate, in accordance with an embodiment of the present disclosure.

Referring to part (a) of FIG. 5A, a starting structure includes a nanowire patterning stack 504 above an insulator substrate. The insulator substrate includes a lower semiconductor portion 502 and an upper insulator portion 503. A lithographic patterning stack 506 is formed above the nanowire patterning stack 504. The nanowire patterning stack 504 includes alternating silicon germanium layers 510 and silicon layers 512. A protective mask 514 is between the nanowire patterning stack 504 and the lithographic patterning stack 506. In one embodiment, the lithographic patterning stack 506 is trilayer mask composed of a topographic masking portion 520, an anti-reflective coating (ARC) layer 522, and a photoresist layer 524. In a particular such embodiment, the topographic masking portion 520 is a carbon hardmask (CHM) layer and the anti-reflective coating layer 522 is a silicon ARC layer.

Referring to part (b) of FIG. 5A, the stack of part (a) is lithographically patterned and then etched to provide an etched structure on the upper insulator portion 503 of the insulator substrate. The etched structure includes trenches 530 and a patterned topographic masking layer 520'.

Referring to part (c) of FIG. 5A, the etched structure of part (b) has sacrificial spacers 540 formed in the trenches 530. The sacrificial spacers 540 may be formed using a blanket deposition and anisotropic etch process.

Referring to part (d) of FIG. 5B, a SAGE material is formed in trenches 530, between the sacrificial spacers 540. The structure is then planarized to leave patterned topographic masking layer 520' as an exposed upper layer, and to provide SAGE walls 542 adjacent the sacrificial spacers 540.

Referring to part (e) of FIG. 5B, the sacrificial spacers 540 are then removed to leave stand-alone SAGE walls 542.

Referring to part (f) of FIG. 5B, the silicon germanium layers 510 are removed at least in the channel region to release silicon nanowires 512A and 512B. Subsequently, gate stacks 599A and 599B are formed around nanowires 512B or 512A, over upper insulator portion 503 of the insulator substrate, and between SAGE walls 542. In one embodiment, prior to formation of the gate stacks, the remaining portion of protective mask 514 is removed. In another embodiment, the remaining portion of protective mask 514 is retained as an insulating hat as an artifact of the processing scheme.

Referring again to part (f) of FIG. 5B, it is to be appreciated that a channel view is depicted, with source or drain regions being locating into and out of the page. In an embodiment, the channel region including nanowires 512B has a width less than the channel region including nanowires 512A. Thus, in an embodiment, an integrated circuit structure includes multiple width (multi-Wsi) nanowires. Although structures of 512B and 512A may be differentiated as nanowires and nanoribbons, respectively, both such structures are typically referred to herein as nanowires. It is also to be appreciated that reference to or depiction of a nanowire stack throughout may refer to a structure including one or more vertically arranged nanowires (e.g., two vertically arranged nanowires are shown in each stack in FIGS. 5A and 5B).

To highlight an exemplary nanowire structure including three nanowires, FIG. 6A illustrates a three-dimensional cross-sectional view of a nanowire-based semiconductor structure, in accordance with an embodiment of the present disclosure. FIG. 6B illustrates a cross-sectional source or drain view of the nanowire-based semiconductor structure of FIG. 6A, as taken along the a-a' axis. FIG. 6C illustrates a cross-sectional channel view of the nanowire-based semiconductor structure of FIG. 6A, as taken along the b-b' axis.

Referring to FIG. 6A, a semiconductor device 600 includes one or more vertically stacked nanowires (604 set) above an insulator substrate. The insulator substrate includes a lower semiconductor portion 602 and an upper insulator portion 603. Embodiments herein are targeted at both single wire devices and multiple wire devices. As an example, a three nanowire-based devices having nanowires 604A, 604B and 604C is shown for illustrative purposes. For convenience of description, nanowire 604A is used as an example where description is focused on one of the nanowires. It is to be appreciated that where attributes of one nanowire are described, embodiments based on a plurality of nanowires may have the same attributes for each of the nanowires.

Each of the nanowires 604 includes a channel region 606 in the nanowire. The channel region 606 has a length (L). Referring to FIG. 6C, the channel region also has a perimeter (Pc) orthogonal to the length (L). Referring to both FIGS. 6A and 6C, a gate electrode stack 608 surrounds the entire perimeter (Pc) of each of the channel regions 606. The gate electrode stack 608 includes a gate electrode along with a gate dielectric layer between the channel region 606 and the gate electrode (not shown). The channel region is discrete in that it is completely surrounded by the gate electrode stack 608 without any intervening material such as underlying substrate material or overlying channel fabrication materials. Accordingly, in embodiments having a plurality of nanowires 604, the channel region 606 of the nanowires are also discrete relative to one another.

Each of the nanowires 604 also includes source and drain regions 610 and 612 in the nanowire on either side of the channel region 606. Referring to FIG. 6B, the source or drain regions 610/612 have a perimeter (Psd) orthogonal to the length (L) of the channel region 606. Referring to both FIGS. 6A and 6B, a pair of contacts 614 surrounds the entire perimeter (Psd) of each of the source or drain regions 610/612. The source or drain regions 610/612 are discrete in that they are completely surrounded by the contacts 614 without any intervening material such as underlying substrate material or overlying channel fabrication materials. Accordingly, in embodiments having a plurality of nanowires 604, the source or drain regions 610/612 of the nanowires are also discrete relative to one another. In another embodiment, the source or drain regions are replaced with single epitaxial source or drain structures.

Referring again to FIG. 6A, in an embodiment, the semiconductor device 600 further includes a pair of spacers 616. The spacers 616 are between the gate electrode stack 608 and the pair of contacts 614. In an embodiment, although not depicted, the source or drain regions 610/612 of the nanowires 604 are uniformly doped around the perimeter (Psd) of each of the regions. In one such embodiment (also not shown), a doping layer is on and completely surrounding the perimeter of each of the source or drain regions 610/612, between the source or drain regions 610/612 and the contact regions 614. In a specific such embodiment, the doping layer is a boron doped silicon germanium layer, e.g., for a PMOS device. In another specific such embodiment, the doping layer is a phosphorous doped silicon layer, e.g., for an NMOS device.

The insulator substrate may be composed of a material suitable for semiconductor device fabrication. In one embodiment, the insulator substrate includes the lower semiconductor portion 602 composed of a single crystal of a material which may include, but is not limited to, silicon, germanium, silicon-germanium or a III-V compound semiconductor material. The upper insulator layer 603 is composed of a material which may include, but is not limited to, silicon dioxide, silicon nitride or silicon oxy-nitride is on the lower bulk substrate. Thus, the structure 600 may be fabricated from a starting semiconductor-on-insulator substrate.

In an embodiment, the nanowires 604 may be sized as wires or ribbons, as described below, and may have squared-off or rounder corners. In an embodiment, the nanowires 604 are composed of a material such as, but not limited to, silicon, germanium, or a combination thereof. In one such embodiment, the nanowires are single-crystalline. For example, for a silicon nanowire 604, a single-crystalline nanowire may be based from a (100) global orientation, e.g., with a <100> plane in the z-direction. As described below, other orientations may also be considered. In an embodiment, the dimensions of the nanowires 604, from a cross-sectional perspective, are on the nano-scale. For example, in a specific embodiment, the smallest dimension of the nanowires 604 is less than approximately 20 nanometers. In an embodiment, the nanowires 604 are composed of a strained material, particularly in the channel regions 606.

Referring to FIGS. 6B and 6C, in an embodiment, each of the channel regions 606 has a width (Wc) and a height (Hc), the width (Wc) approximately the same as the height (Hc), and each of the source or drain regions 610/612 has a width (Wsd) and a height (Hsd), the width (Wsd) approximately the same as the height (Hsd). That is, in both cases, the channel regions 606 and the source or drain region 610/612 are square-like or, if corner-rounded, circle-like in cross-section profile. In one such embodiment, Wc and Wsd are approximately the same, and Hc and Hsd are approximately the same, as reflected in FIGS. 6B and 6C.

Figure 7A:
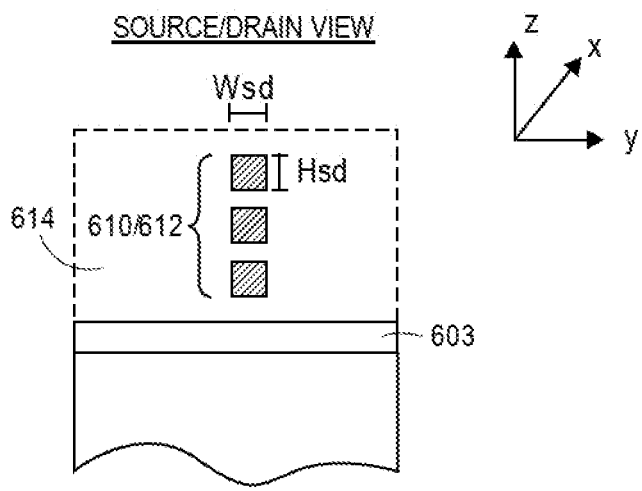
FIG. 7A illustrates a cross-sectional source or drain view of another nanowire-based semiconductor structure, in accordance with an embodiment of the present disclosure.
Figure 7B:
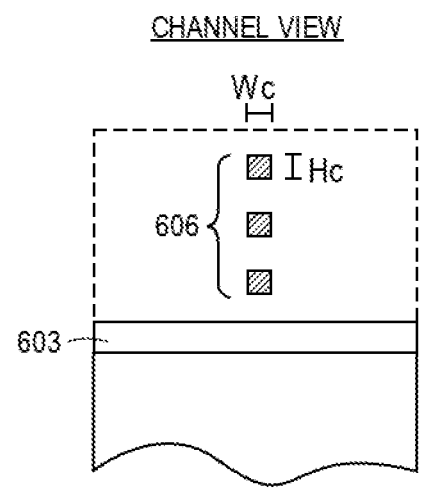
FIG. 7B illustrates a cross-sectional channel view of the nanowire-based semiconductor structure of FIG. 7A, in accordance with an embodiment of the present disclosure.

However, in another aspect, the perimeter of the channel region (Pc) may be smaller than the perimeter of the source or drain regions 610/612 (Psd). For example, in accordance with another embodiment of the present disclosure, FIG. 7A illustrates a cross-sectional source or drain view of another nanowire-based semiconductor structure. FIG. 7B illustrates a cross-sectional channel view of the nanowire-based semiconductor structure of FIG. 7A.

Referring to FIGS. 7A and 7B, in an embodiment, each of the channel regions 606 has a width (Wc) and a height (Hc), the width (Wc) approximately the same as the height (Hc). Each of the source or drain regions 610/612 has a width (Wsd) and a height (Hsd), the width (Wsd) approximately the same as the height (Hsd). That is, in both cases, the channel regions 606 and the source or drain region 610/612 are square-like or, if corner-rounded, circle-like in cross-section profile. However, in one such embodiment, Wc is less than Wsd, and Hc is less than Hsd, as reflected in FIGS. 7A and 7B. In a specific such embodiments, the perimeters of the source region 610 and the drain region 612 are approximately the same. In another embodiment, the source or drain regions are replaced with single epitaxial source or drain structures. Accordingly, the perimeters of each of the source or drain regions 610/612 are greater than the perimeter of the channel regions 606. Methods to fabricate such an arrangement are described in detail below in association with FIGS. 9A-9E.

Figure 8A:
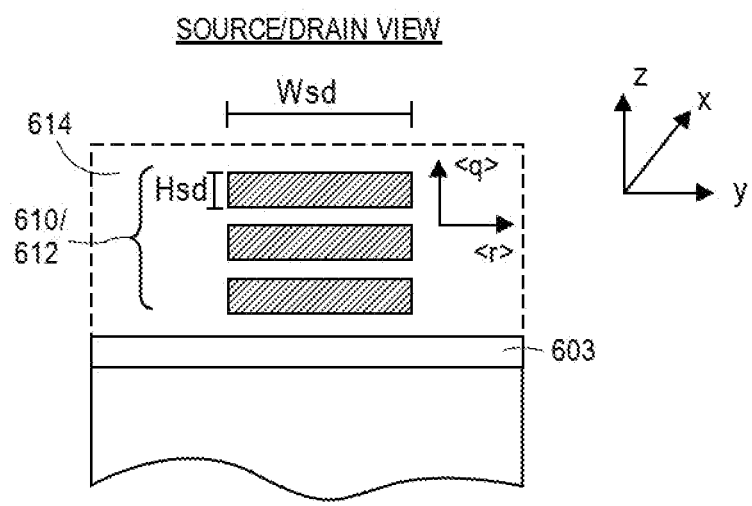
FIG. 8A illustrates a cross-sectional source or drain view of another nanowire-based semiconductor structure, in accordance with an embodiment of the present disclosure.
Figure 8B:
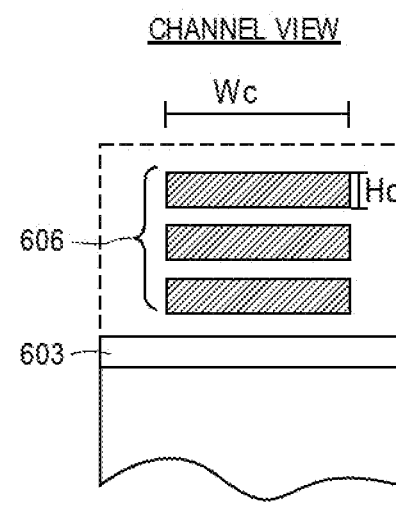
FIG. 8B illustrates a cross-sectional channel view of the nanowire-based semiconductor structure of FIG. 8A, in accordance with an embodiment of the present disclosure.

In another aspect, width and height of the channel region need not be the same and likewise, the width and height of the source or drain regions need not be the same. For example, in accordance with another embodiment of the present disclosure, FIG. 8A illustrates a cross-sectional source or drain view of another nanowire-based semiconductor structure. FIG. 8B illustrates a cross-sectional channel view of the nanowire-based semiconductor structure of FIG. 8A.

Referring to FIGS. 8A and 8B, in an embodiment, each of the channel regions 606 has a width (Wc) and a height (Hc). The width (Wc) is substantially greater than the height (Hc). For example, in a specific embodiment, the width Wc is approximately 2-10 times greater than the height Hc. Furthermore, each of the source or drain regions 610/612 has a width (Wsd) and a height (Hsd), the width (Wsd) substantially greater than the height (Hsd). That is, in both cases, the channel regions 606 and the source or drain region 610/612 are rectangular-like or, if corner-rounded, oval-like in cross-section profile. Nanowires with such geometry may be referred to as nanoribbons. In one such embodiment, Wc and Wsd are approximately the same, and Hc and Hsd are approximately the same, as reflected in FIGS. 8A and 8B. However, in another embodiment, the perimeter of the source or drain regions 610/612 is greater than the perimeter of the channel region 606. In another embodiment, the source or drain regions are replaced with single epitaxial source or drain structures.

Contact resistance may depend on both interface area and the barrier between the metal and semiconductor. In an embodiment, methods to improve contact resistance by reducing the barrier between the metal and semiconductor by selecting the most advantageous semiconductor orientations for the metal to contact are provided. For example, in one embodiment, a contact all around structure is formed where more of the metal/silicon contact will be with <110> oriented silicon. As an exemplary embodiment to illustrate the concept, reference is made again to FIG. 8A.

Referring to FIG. 8A, the surface of the source or drain region 610/612 oriented with Hsd has a <q> crystal orientation. The surface of the source or drain region 610/612 oriented with Wsd has a <r> crystal orientation. In an embodiment, each of the nanowires is composed of silicon, <q> is a <110> orientation, and <r> is a <100> orientation. That is, the perimeter along the width of each of the source and drain regions is composed of exposed <110> silicon surfaces, and the perimeter along the height of each of the source and drain regions is composed of exposed <100> silicon surfaces. Thus a greater portion of the source or drain region 610/612 to contact 614 interface is based on an interaction with <110> silicon surfaces than with <100> silicon surfaces.

In an alternative embodiment (not shown), the nanoribbons are oriented vertically. That is, each of the channel regions has a width and a height, the width substantially less than the height, and each of the source and drain regions has a width and a height, the width substantially less than the height. In one such embodiment, each of the nanowires is composed of silicon, the perimeter along the width of each of the source and drain regions is composed of exposed <100> silicon surfaces, and the perimeter along the height of each of the source and drain regions is composed of exposed <110> silicon surfaces.

As described above, the channel regions and the source or drain regions are, in at least several embodiments, made to be discrete. However, not all regions of the nanowire need be, or even can be made to be discrete. For example, a cross-sectional spacer view of a nanowire-based semiconductor structure includes nanowires 604A-604C that are not discrete at the location under spacers 616. In one embodiment, the stack of nanowires 604A-604C have an intervening semiconductor material there between, such as silicon germanium intervening between silicon nanowires, or vice versa, as described below in association with FIG. 9B.

In another aspect, methods of fabricating a nanowire-based semiconductor device are described. For example, FIGS. 9A-9E illustrate three-dimensional cross-sectional views representing various operations in a method of fabricating a nanowire portion of a nanowire structure, in accordance with an embodiment of the present disclosure. It is to be appreciated that, for clarity, SAGE wall processing is not depicted in association with FIGS. 9A-9E.

Figure 9A:
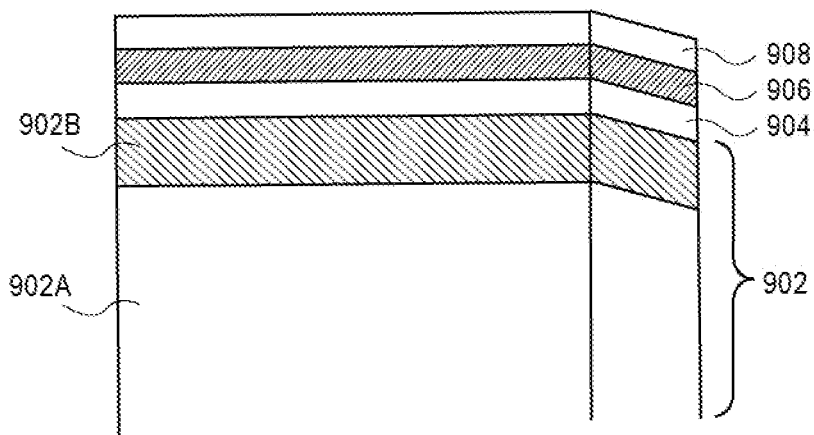
FIGS. 9A-9E illustrate three-dimensional cross-sectional views representing various operations in a method of fabricating a nanowire structure, in accordance with an embodiment of the present disclosure.

A method of fabricating a nanowire semiconductor device may include forming a nanowire above a substrate. In a specific example showing the formation of two silicon nanowires, FIG. 9A illustrates a substrate 902 (e.g., composed of a bulk substrate silicon substrate 902A with an insulating silicon dioxide layer 902B there on) having a silicon layer 904/silicon germanium layer 906/silicon layer 908 stack thereon. It is to be appreciated that, in another embodiment, a silicon germanium layer/silicon layer/silicon germanium layer stack may be used to ultimately form two silicon germanium nanowires.

Figure 9B:
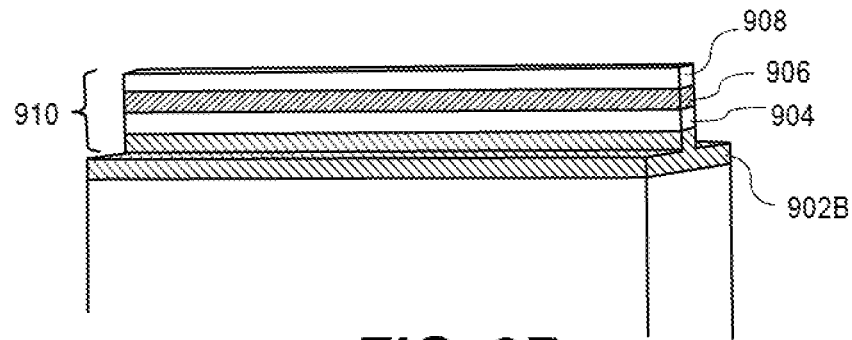

Referring to FIG. 9B, a portion of the silicon layer 904/silicon germanium layer 906/silicon layer 908 stack as well as a top portion of the silicon dioxide layer 902B is patterned into a fin-type structure 910, e.g., with a mask and plasma etch process. It is to be appreciated that, for illustrative purposes, the etch for FIG. 9B is shown as forming two silicon nanowire precursor portions. Although the etch is shown for ease of illustration as ending within a bottom isolation layer, more complex stacks are contemplated within the context of embodiments of the present disclosure.

For example, the process may be applied to a nanowire stack as described in association with FIGS. 5A and 5B.

Figure 9C:
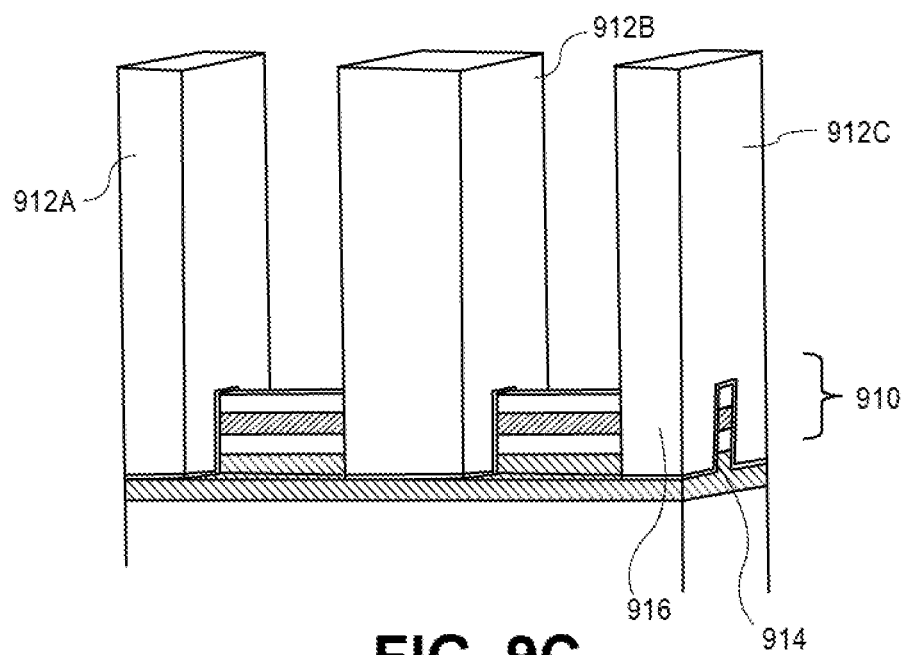

The method may also include forming a channel region in the nanowire, the channel region having a length and a perimeter orthogonal to the length. In a specific example showing the formation of three gate structures over the two silicon nanowires, FIG. 9C illustrates the fin-type structure 910 with three sacrificial gates 912A, 912B, and 912C thereon. In one such embodiment, the three sacrificial gates 912A, 912B, and 912C are composed of a sacrificial gate oxide layer 914 and a sacrificial polysilicon gate layer 916 which are blanket deposited and patterned with a plasma etch process.

Figure 9D:
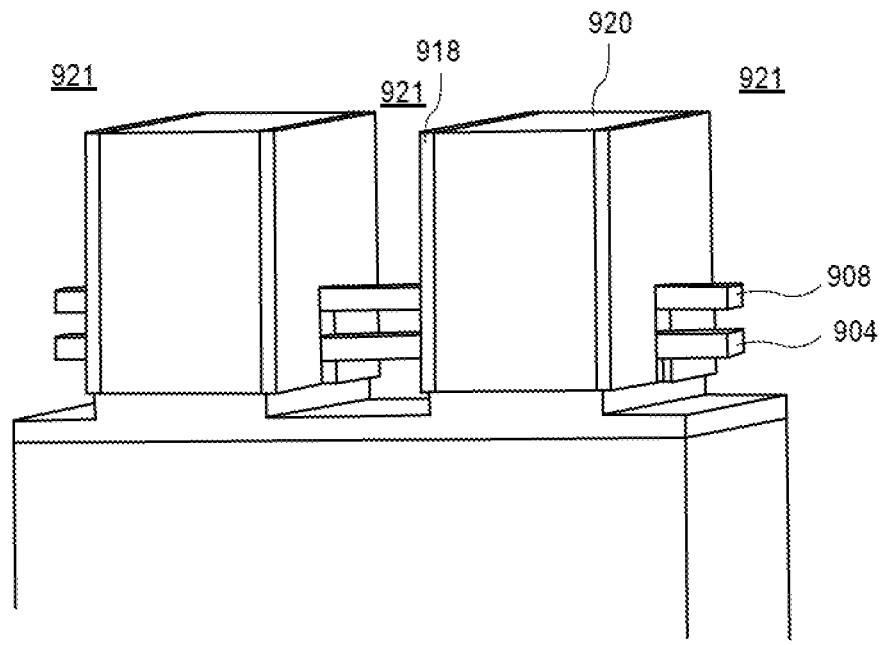

Following patterning to form the three sacrificial gates 912A, 912B, and 912C, spacers may be formed on the sidewalls of the three sacrificial gates 912A, 912B, and 912C, doping may be performed (e.g., tip and/or source and drain type doping), and an interlayer dielectric layer may be formed to cover the three sacrificial gates 912A, 912B, and 912C. The interlayer dielectric layer may be polished to expose the three sacrificial gates 912A, 912B, and 912C for a replacement gate, or gate-last, process. Referring to FIG. 9D, the three sacrificial gates 912A, 912B, and 912C have been removed, leaving spacers 918 and a portion of the interlayer dielectric layer 920 remaining.

Additionally, referring again to FIG. 9D the portions of the silicon germanium layer 906 and the portion of the insulating silicon dioxide layer 902B of the fin structure 910 are removed in the regions originally covered by the three sacrificial gates 912A, 912B, and 912C. Discrete portions of the silicon layers 904 and 908 thus remain, as depicted in FIG. 9D.

The discrete portions of the silicon layers 904 and 908 shown in FIG. 9D will, in one embodiment, ultimately become channel regions in a nanowire-based device. Thus, at the process stage depicted in FIG. 9D, channel engineering or tuning may be performed. For example, in one embodiment, the discrete portions of the silicon layers 904 and 908 shown in FIG. 9D are thinned using oxidation and etch processes. Such an etch process may be performed at the same time the wires are separated by etching the silicon germanium layer 906. Accordingly, the initial wires formed from silicon layers 904 and 908 begin thicker and are thinned to a size suitable for a channel region in a nanowire device, independent from the sizing of the source and drain regions of the device. Thus, in an embodiment, forming the channel region includes removing a portion of the nanowire, and the resulting perimeters of the source and drain regions (described below) are greater than the perimeter of the resulting channel region.

Figure 9E:
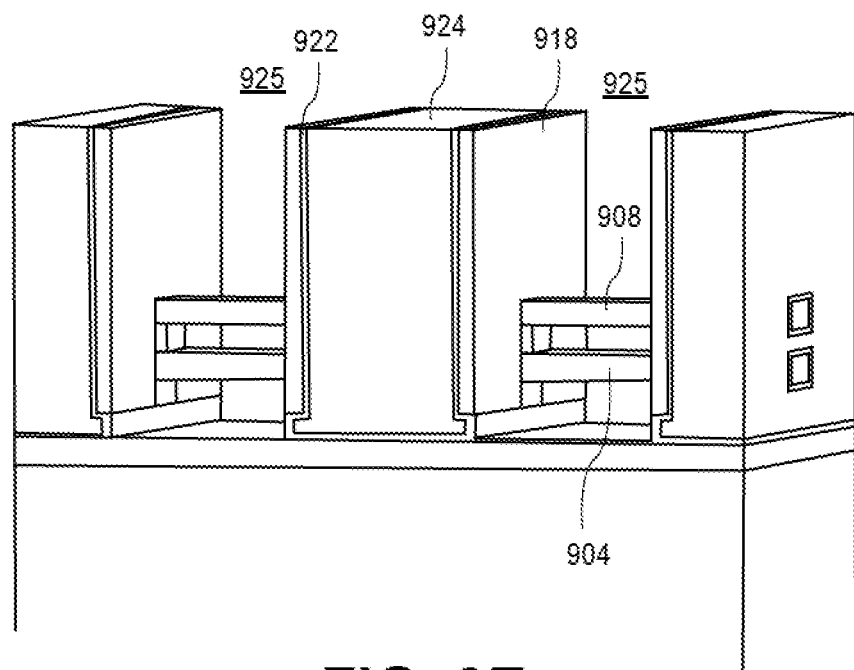

The method may also include forming a gate electrode stack surrounding the entire perimeter of the channel region. In the specific example showing the formation of three gate structures over the two silicon nanowires, FIG. 9E illustrates the structure following deposition of a gate dielectric layer 922 (such as a high-k gate dielectric layer) and a gate electrode layer 924 (such as a metal gate electrode layer), and subsequent polishing, in between the spacers 918. That is, gate structures are formed in the trenches 921 of FIG. 9D. Additionally, FIG. 9E depicts the result of the subsequent removal of the interlayer dielectric layer 920 after formation of the permanent gate stack. The portions of the silicon germanium layer 906 and the portion of the insulating silicon dioxide layer 902B of the fin structure 910 are also removed in the regions originally covered by the portion of the interlayer dielectric layer 920 depicted in FIG. 9D.

Discrete portions of the silicon layers 904 and 908 thus remain, as depicted in FIG. 9E.

The method may also include forming a pair of source and drain regions in the nanowire, on either side of the channel region, each of the source and drain regions having a perimeter orthogonal to the length of the channel region. Specifically, the discrete portions of the silicon layers 904 and 908 shown in FIG. 9E will, in one embodiment, ultimately become at least a portion of, if not entirely, the source and drain regions in a nanowire-based device. Thus, at the process stage depicted in FIG. 9E, source and drain region engineering or tuning may be performed, example of which follow. It is to be appreciated that similar engineering or tuning may instead be performed earlier in a process flow, e.g., prior to deposition of an inter-layer dielectric layer and formation of permanent gate electrodes.

In an embodiment, forming the pair of source and drain regions includes growing (e.g., by epitaxial growth) to expand a portion of the nanowire. The perimeters of the source and drain regions may be fabricated to be greater than the perimeter of the channel region in this way. In one such embodiment, the nanowire is composed of silicon, and growing the portion of the nanowire includes forming exposed <111> silicon surfaces along the entire perimeter of each of the source and drain regions. In a specific such embodiment, forming the exposed <111> silicon surfaces includes using a deposition and subsequent selective faceted etch process. Thus, <111> oriented surfaces may be fabricated by either depositing epitaxial silicon to directly provide <111> facets or by depositing silicon and using an orientation dependent silicon etch. In yet another embodiment, the process begins with a thicker nanowire followed by subsequent etching using an orientation dependent silicon etch. In an embodiment, forming the pair of source and drain regions includes forming a doping layer on and completely surrounding the perimeter of each of the source and drain regions, e.g., a boron doped silicon germanium layer. This layer may facilitate formation of a nanowire with a uniformly doped perimeter.

The method may also include forming a pair of contacts, a first of the pair of contacts completely surrounding the perimeter of the source region, and a second of the pair of contacts completely surrounding the perimeter of the drain region. Specifically, contacts are formed in the trenches 925 of FIG. 9E. The resulting structure may be similar to, or the same as, the structure 600 of FIG. 6A. In an embodiment, the contacts are formed from a metallic species. In one such embodiment, the metallic species is formed by conformally depositing a contact metal and then filling any remaining trench volume. The conformal aspect of the deposition may be performed by using chemical vapor deposition (CVD), atomic layer deposition (ALD), or metal reflow.

In another aspect, system-on-chip (SoC) process technologies typically require support of standard logic (e.g., low voltage, thin-oxide) and I/O (e.g., high voltage, thick-oxide) transistors. The distinction between standard logic and high voltage (HVI/O) devices may be accomplished through a multi-oxide process sequence, where logic transistors receive a thin, high-performance oxide and I/O devices receive a thick oxide capable to sustain higher voltages. As process technologies scale, the logic devices aggressively scale in dimension, creating fabrication challenges with dual-oxide formation. In accordance with one or more embodiments of the present disclosure, a high voltage/ dual endcap process is used for fabrication of an ultra-scaled nanowire transistor architecture.

To provide context, as technology nodes scale smaller, there is an increasing lack of geometrical space in a narrow-endcap logic device to accommodate a defect-free dual oxide process that may be needed for high-voltage transistor fabrication. Current approaches rely upon a single, unscaled endcap space to accommodate a single logic oxide process. However, such a process may be incompatible with highly scaled geometries supporting a dual-oxide high-voltage SoC technology, since the endcap space may be insufficient to accommodate both oxides (gate dielectrics).

In accordance with an embodiment of the present disclosure, scaling limitation imposed by requirements fill high-voltage gates with both the high-voltage oxide and logic oxide are addressed. In particular, as logic dimensions decrease, the endcap space in high voltage (HV) devices becomes insufficiently narrow to fill both oxides. In an embodiment, different endcap spaces between logic transistor and high-voltage transistor, respectively, are fabricated in a SAGE architecture prior to a wire cut process. The logic transistor endcap is ultra-scaled by using the self-aligned endcap architecture, while the high-voltage transistor has a wider endcap to accommodate a thicker gate dielectric. Both endcaps are unidirectional endcaps in that they are formed by to wire cut processing.

One or more embodiments described herein are directed to, or may be referred to as, a dual unidirectional endcap process flow for ultra-scaled logic endcap. To provide context, in a typical SAGE flow, a single endcap spacer is deposited to form a self-aligned endcap separating a wire from a SAGE wall. Embodiments described herein may involve formation of differential sacrificial spacer thickness between logic and HV gates. Subsequently, a self-aligned endcap wall is formed. The differential spacer widths are chosen to be thicker in the high voltage areas, and the standard thickness is used in the logic areas. The differential spacer widths may enable high-voltage oxide to be successfully deposited, without sacrificing density in the logic areas. In an embodiment, the thickness of the differential spacer is dependent on the intended HV oxide thickness.

In an embodiment, nanowire-based or nanoribbon-based structures described herein are formed from a plurality of starting fin lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, grating-like nanowire patterns may have lines spaced at a constant pitch and having a constant width. The pattern may be fabricated by a pitch halving or pitch quartering, or other pitch division, approach. Each of the individual starting fins or resulting nanowire or nanowire stacks depicted herein may represent corresponding individual starting fins or resulting nanowire or nanowire stacks, or may represent a plurality of starting fins or resulting nanowire or nanowire stacks at a given location.

In an embodiment, nanowire-based or nanoribbon-based structures described herein includes a single gate line or a plurality of parallel gate lines. In one embodiment, such a plurality of gate lines that form a grating structure such as a tight pitch grating structure. In one such embodiment, the tight pitch is not achievable directly through conventional lithography. For example, a pattern based on conventional lithography may first be formed, but the pitch may be halved by the use of spacer mask patterning, as is known in the art.

Even further, the original pitch may be quartered by a second round of spacer mask patterning. Accordingly, grating-like gate patterns may have lines spaced at a constant pitch and having a constant width. The pattern may be fabricated by a pitch halving or pitch quartering, or other pitch division, approach.

In an embodiment, nanowire-based or nanoribbon-based structures described herein includes source and drain regions that are doped portions of original material of the starting fin or resulting nanowire portions. In another embodiment, the material of the starting fin or resulting nanowire portions is removed and replaced with another semiconductor material, e.g., by epitaxial deposition.

In an embodiment, nanowire-based or nanoribbon-based structures described herein include an insulator substrate having a lower semiconductor portion. In an embodiment, lower semiconductor portion is composed of a crystalline silicon, silicon/germanium or germanium layer which may be doped with a charge carrier, such as but not limited to phosphorus, arsenic, boron or a combination thereof. In one embodiment, the concentration of silicon atoms in lower semiconductor portion is greater than 97%. In another embodiment, lower semiconductor portion is composed of a group III-V material. In an embodiment, lower semiconductor portion is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, lower semiconductor portion is composed of a III-V material and the charge-carrier dopant impurity atoms are ones such as, but not limited to, carbon, silicon, germanium, oxygen, sulfur, selenium or tellurium.

In an embodiment, nanowire-based or nanoribbon-based structures described herein include an insulator substrate having an upper insulator layer composed of a material suitable to ultimately electrically isolate, or contribute to the isolation of, portions of a permanent gate structure from an underlying semiconductor substrate portion, or restrict leakage paths from source to drain regions, or both. For example, in one embodiment, the upper insulator layer of an insulator substrate is composed of a dielectric material such as, but not limited to, silicon dioxide, silicon oxy-nitride, silicon nitride, or carbon-doped silicon nitride.

In an embodiment, nanowire-based or nanoribbon-based structures described herein include self-aligned gate endcap isolation structures composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

In an embodiment, nanowire-based or nanoribbon-based structures described herein include gate structures that may be composed of a gate electrode stack which includes a gate dielectric layer and a gate electrode layer. In an embodiment, the gate electrode of the gate electrode stack is composed of a metal gate and the gate dielectric layer includes a high-K material.

In an embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor nanowire. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In an embodiment, the top high-k portion consists of a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Local interconnects, gate contacts, overlying gate contact vias, and overlying metal interconnects may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material). A common example is the use of copper structures that may or may not include barrier layers (such as Ta or TaN layers) between the copper and surrounding ILD material. As used herein, the term metal includes alloys, stacks, and other combinations of multiple metals. For example, the metal interconnect lines may include barrier layers, stacks of different metals or alloys, etc.

In an embodiment, source or drain conductive trench contacts are used to make source or drain contact. In one such embodiment, a trench contact pattern is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, gate structures described herein may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at a fabricated structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In an embodiment, a semiconductor device described herein has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

As applicable to embodiments described herein, it is to be appreciated that SAGE walls of varying width may be fabricated. It is also to be appreciated that fabrication of gate endcap isolation structures may lead to formation of a vertical seam within the gate endcap isolation structures. It is also to be appreciated that a stack of dielectric layers may be used to form a SAGE wall. It is also to be appreciated that gate endcap isolation structures may differ in composition depending on the spacing of adjacent wires or stacks of wires.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an antireflective coating (ARC) layer, and a photoresist layer. In a particular such embodiment, the topographic masking portion is a carbon hardmask (CHM) layer and the antireflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
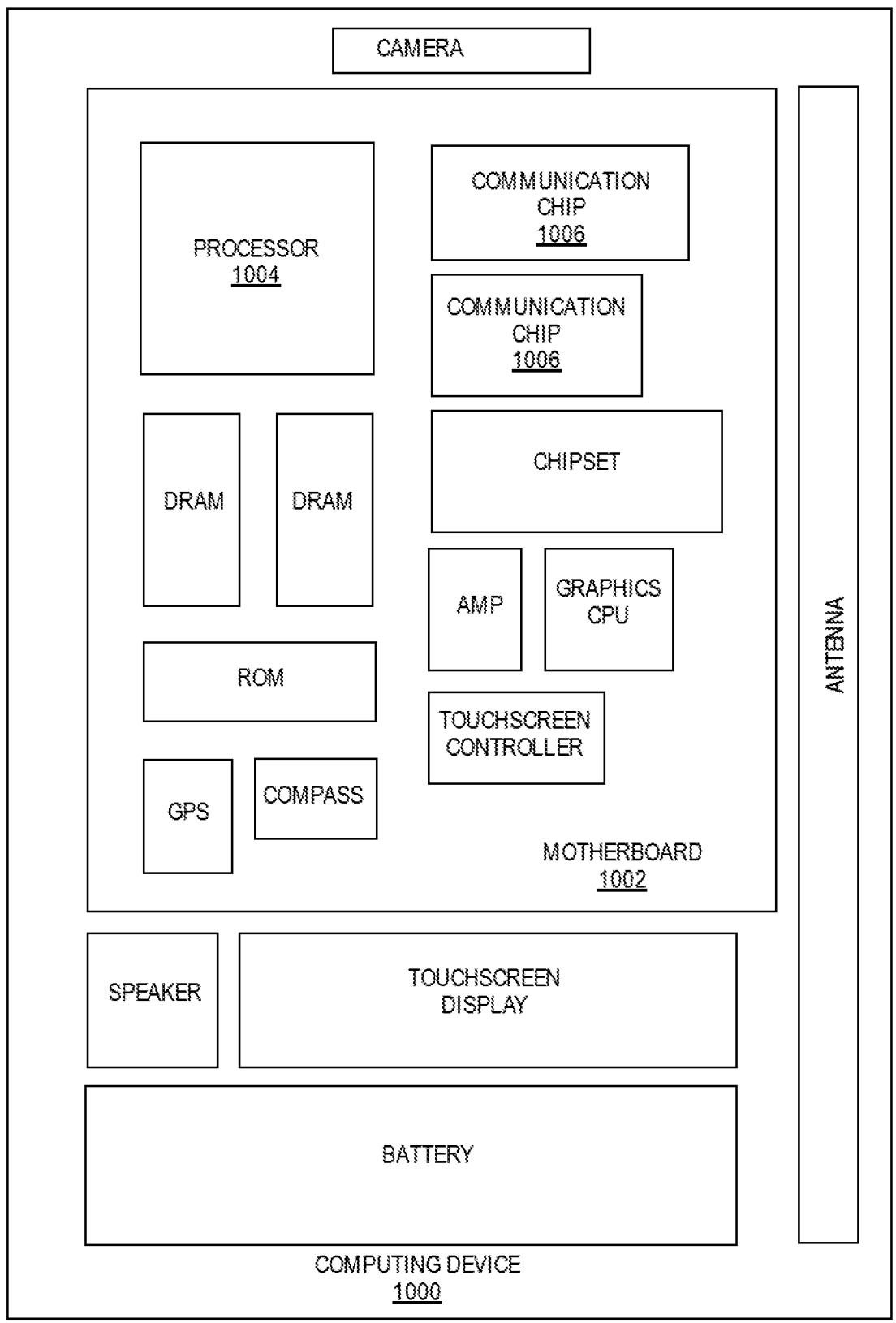
FIG. 10 illustrates a computing device in accordance with one implementation of an embodiment of the disclosure.

FIG. 10 illustrates a computing device 1000 in accordance with one implementation of an embodiment of the present disclosure. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. The integrated circuit die of the processor 1004 may include one or more structures, such as self-aligned gate endcap (SAGE) structures built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. The integrated circuit die of the communication chip 1006 may include one or more structures, such as self-aligned gate endcap (SAGE) structures built in accordance with implementations of embodiments of the present disclosure.

In further implementations, another component housed within the computing device 1000 may contain an integrated circuit die that includes one or structures, such as self-aligned gate endcap (SAGE) structures built in accordance with implementations of embodiments of the present disclosure.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
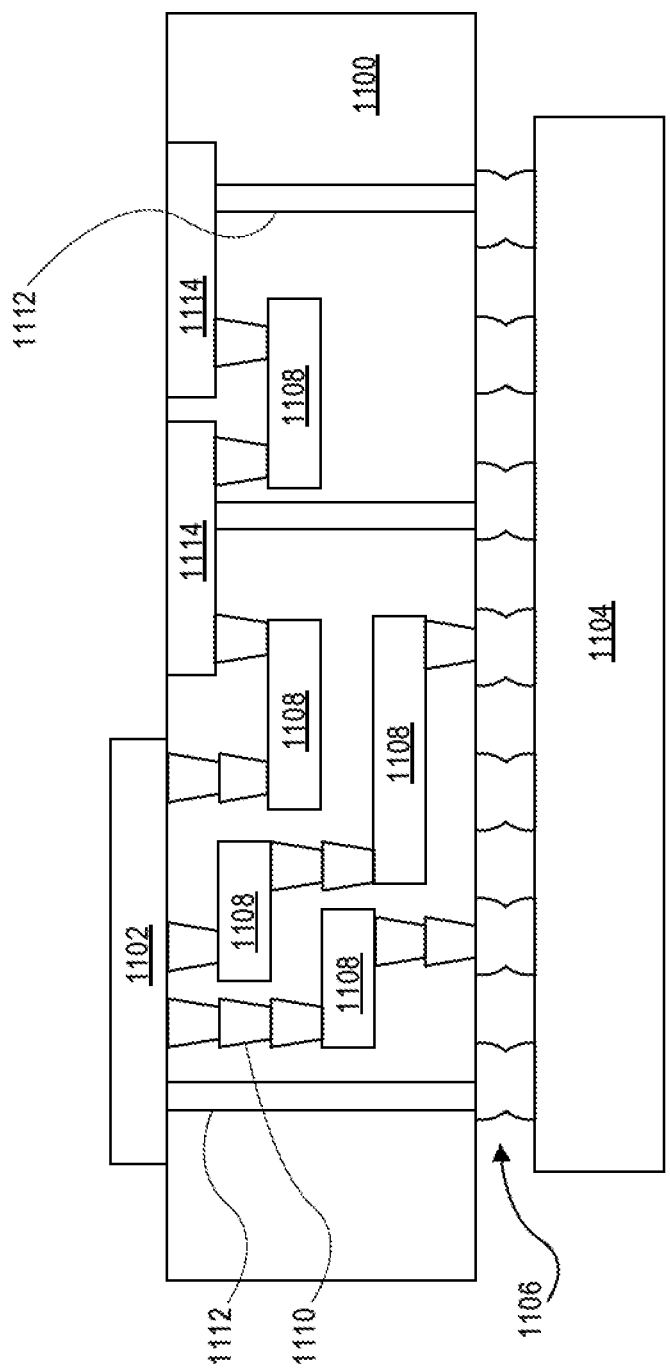
FIG. 11 illustrates an interposer that includes one or more embodiments of the disclosure.

FIG. 11 illustrates an interposer 1100 that includes one or more embodiments of the present disclosure. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer 1100 may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the disclosure, apparatuses or processes disclosed herein may be used in the fabrication of interposer 1100 or in the fabrication of components included in the interposer 1100.

Thus, embodiments of the present disclosure include self-aligned gate endcap (SAGE) architectures with gate-all-around devices above insulator substrates, and methods of fabricating self-aligned gate endcap (SAGE) architectures with gate-all-around devices above insulator substrates.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure includes a semiconductor nanowire above an insulator substrate and having a length in a first direction. A gate structure is around the semiconductor nanowire, the gate structure having a first end opposite a second end in a second direction, orthogonal to the first direction. A pair of gate endcap isolation structures is included, where a first of the pair of gate endcap isolation structures is spaced equally from a first side of the semiconductor nanowire as a second of the pair of gate endcap isolation structures is spaced from a second side of the semiconductor nanowire. The first of the pair of gate endcap isolation structures is directly adjacent to the first end of the gate structure, and the second of the pair of gate endcap isolation structures is directly adjacent to the second end of the gate structure.

Example Embodiment 2

The integrated circuit structure of example embodiment 1, further including source and drain regions adjacent the semiconductor nanowire, on either side of the gate structure, and further including a first trench contact over the source region and a second trench contact over the drain region.

Example Embodiment 3

The integrated circuit structure of example embodiment 1 or 2, further including a second semiconductor nanowire above the substrate and having a length in the first direction, the second semiconductor nanowire spaced apart from the first semiconductor nanowire, a second gate structure around the second semiconductor nanowire, the second gate structure having a first end opposite a second end in the second direction, where the second of the pair of gate endcap isolation structures is directly adjacent to the first end of the second gate structure. The integrated circuit structure further includes a third gate endcap isolation structure directly adjacent to the second end of the second gate structure, where the third gate endcap isolation structure and the second of the pair of gate endcap isolation structures are centered with the second semiconductor nanowire.

Example Embodiment 4

The integrated circuit structure of example embodiment 3, further including a local interconnect above and electrically coupling the first and second gate structures.

Example Embodiment 5

The integrated circuit structure of example embodiment 3 or 4, wherein the second semiconductor nanowire is wider than the nanowire.

Example Embodiment 6

The integrated circuit structure of example embodiment 1, 2, 3, 4 or 5, wherein the gate structure includes a high-k gate dielectric layer and a metal gate electrode.

Example Embodiment 7

The Integrated Circuit Structure of Example embodiment 1, 2, 3, 4, 5 or 6, wherein the pair of gate endcap isolation structures includes a material selected from the group consisting of silicon oxide, silicon nitride, silicon carbide, and a combination thereof.

Example Embodiment 8

The integrated circuit structure of example embodiment 1, 2, 3, 4, 5, 6 or 7, wherein the pair of gate endcap isolation structure include a lower dielectric portion and a dielectric cap on the lower dielectric portion.

Example Embodiment 9

The integrated circuit structure of example embodiment 1, 2, 3, 4, 5, 6, 7 or 8, wherein at least one of the pair of gate endcap isolation structures includes a vertical seam centered therein.

Example Embodiment 10

An integrated circuit structure includes a first nanowire having a longest dimension along a first direction above an insulator substrate. A second nanowire having a longest dimension is along the first direction above the insulator substrate. A first gate structure is around the first nanowire, the first gate structure having a longest dimension along a second direction, the second direction orthogonal to the first direction. A second gate structure is around the second nanowire, the second gate structure having a longest dimension along the second direction, the second gate structure discontinuous with the first gate structure along the second direction, and the second gate structure having an edge facing an edge of the first gate structure along the second direction. A gate endcap isolation structure is between and in contact with the edge of the first gate structure and the edge of the second gate structure along the second direction, the gate endcap isolation structure having a length along the first direction greater than a length of the first gate structure and the second gate structure along the first direction.

Example Embodiment 11

The integrated circuit structure of example embodiment 10, wherein the second nanowire is wider than the nanowire.

Example Embodiment 12

The integrated circuit structure of example embodiment 10 or 11, wherein the gate endcap isolation structure include a lower dielectric portion and a dielectric cap on the lower dielectric portion.

Example Embodiment 13

The integrated circuit structure of example embodiment 10, 11 or 12, wherein the gate endcap isolation structure includes a vertical seam centered therein.

Example Embodiment 14

The integrated circuit structure of example embodiment 10, 11, 12 or 13, further including a dielectric material laterally adjacent to and in contact with the gate endcap isolation structure, and the dielectric material having a composition different than a composition of the gate endcap isolation structure.

Example Embodiment 15

The integrated circuit structure of example embodiment 10, 11, 12, 13 or 14, wherein the first gate structure includes a first gate dielectric layer and a first gate electrode, and wherein the second gate structure includes a second gate dielectric layer and a second gate electrode.

Example Embodiment 16

The integrated circuit structure of example embodiment 15, wherein the gate endcap isolation structure is in contact with the gate dielectric layer of the first gate structure and with the gate dielectric layer of the second gate structure.

Example Embodiment 17

The integrated circuit structure of example embodiment 10, 11, 12, 13, 14, 15 or 16, wherein the gate endcap isolation structure has a height greater than a height of the first gate structure and greater than a height of the second gate structure.

Example Embodiment 18

The integrated circuit structure of example embodiment 17, further including a local interconnect over a portion of the first gate structure, over a portion of the gate endcap isolation structure, and over a portion of the second gate structure.

Example Embodiment 19

The integrated circuit structure of example embodiment 18, wherein the local interconnect electrically couples the first gate structure to the second gate structure.

Example Embodiment 20

The integrated circuit structure of example embodiment 19, further including a gate contact on a portion of the local interconnect over the first gate structure, but not on a portion of the local interconnect over the second gate structure.

Example Embodiment 21

An integrated circuit structure includes a first semiconductor nanowire stack above an insulator substrate, the first semiconductor nanowire stack having a cut along a length of the first semiconductor nanowire stack. A second semiconductor nanowire stack is above the insulator substrate, the second semiconductor nanowire stack having a cut along a length of the second semiconductor nanowire stack. A gate endcap isolation structure is between the first semiconductor nanowire stack and the second semiconductor nanowire stack. The gate endcap isolation structure has a substantially uniform width along the lengths of the first and second semiconductor nanowire stacks.

Example Embodiment 22

The integrated circuit structure of example embodiment 21, wherein the gate endcap isolation structure includes a lower dielectric portion and a dielectric cap on the lower dielectric portion.

Example Embodiment 23

The integrated circuit structure of example embodiment 21 or 22, wherein the gate endcap isolation structure includes a vertical seam centered within the gate endcap isolation structure.

What is claimed is:

1. An integrated circuit structure, comprising:
a first semiconductor nanowire above an insulator substrate and having a length in a first direction, the first semiconductor nanowire having a width in a second direction orthogonal to the first direction, and the first semiconductor nanowire having a bottommost surface, and the insulator substrate having an upper insulator portion;
a second semiconductor nanowire above the substrate and having a length in the first direction, the second semiconductor nanowire having a width in the second direction different than the width of the first semiconductor nanowire, and the second semiconductor nanowire having a bottommost surface at a same level as the bottommost surface of the first semiconductor nanowire, and the second semiconductor nanowire spaced apart from the first semiconductor nanowire;
a first gate structure around the first semiconductor nanowire, the first gate structure having a first end opposite a second end in the second direction, the first gate structure having a first gate electrode;
a second gate structure around the second semiconductor nanowire, the second gate structure having a first end opposite a second end in the second direction, the second gate structure having a second gate electrode; and
a pair of gate endcap isolation structures on and in direct physical contact with an uppermost surface of the upper insulator portion of the insulator substrate, wherein a first of the pair of gate endcap isolation structures is spaced equally from a first side of the first semiconductor nanowire as a second of the pair of gate endcap isolation structures is spaced from a second side of the first semiconductor nanowire, wherein the first of the pair of gate endcap isolation structures is directly adjacent to the first end of the first gate structure, and the second of the pair of gate endcap isolation structures is directly adjacent to the second end of the first gate structure, wherein the second of the pair of gate endcap isolation structures is directly adjacent to the first end of the second gate structure, and wherein the first and the second of the pair of gate endcap isolation structures have an uppermost surface above an uppermost surface of the first gate electrode and the second gate electrode, wherein the first and the second of the pair of gate endcap isolation structures do not extend vertically over the first gate structure and the second gate structure, and wherein one or both of the pair of gate endcap isolation structures comprises a lower dielectric portion and a dielectric cap on the lower portion, the dielectric cap having a bottommost surface below an uppermost surface of the first semiconductor nanowire and an uppermost surface of the second semiconductor nanowire.

2. The integrated circuit structure of claim 1, further comprising:
source and drain regions adjacent the first semiconductor nanowire, on either side of the first gate structure; and
a first trench contact over the source region and a second trench contact over the drain region.

3. The integrated circuit structure of claim 1, further comprising:
a third gate endcap isolation structure directly adjacent to the second end of the second gate structure, wherein the third gate endcap isolation structure and the second of the pair of gate endcap isolation structures are centered with the second semiconductor nanowire.

4. The integrated circuit structure of claim 1, wherein the first gate structure comprises a high-k gate dielectric layer and a metal gate electrode.

5. The integrated circuit structure of claim 1, wherein the pair of gate endcap isolation structures comprises a material selected from the group consisting of silicon oxide, silicon nitride, silicon carbide, and a combination thereof.

6. An integrated circuit structure, comprising:
a first nanowire having a longest dimension along a first direction above an insulator substrate, the first nanowire having a width in a second direction orthogonal to the first direction, and the first nanowire having a bottommost surface, and the insulator substrate having an upper insulator portion;
a second nanowire having a longest dimension along the first direction above the insulator substrate, the second nanowire having a width in the second direction different than the width of the first nanowire, and the second nanowire having a bottommost surface at a same level as the bottommost surface of the first nanowire;
a first gate structure around the first nanowire, the first gate structure having a longest dimension along the second direction, the first gate structure having a first gate electrode;
a second gate structure around the second nanowire, the second gate structure having a longest dimension along the second direction, the second gate structure having a second gate electrode, the second gate structure discontinuous with the first gate structure along the second direction, and the second gate structure having an edge facing an edge of the first gate structure along the second direction; and
a gate endcap isolation structure on and in direct physical contact with an uppermost surface of the upper insulator portion of the insulator substrate, the gate endcap isolation structure between and in contact with the edge of the first gate structure and the edge of the second gate structure along the second direction, the gate endcap isolation structure having a length along the first direction greater than a length of the first gate structure and the second gate structure along the first direction, wherein the gate endcap isolation structure has an uppermost surface above an uppermost surface of the first gate electrode and the second gate electrode, wherein the gate endcap isolation structure does not extend vertically over the first gate structure, and the gate endcap isolation structure does not extend vertically over the second gate structure, and wherein the gate endcap isolation structure comprises a lower dielectric portion and a dielectric cap on the lower portion, the dielectric cap having a bottommost surface below an uppermost surface of the first nanowire and an uppermost surface of the second nanowire.

7. The integrated circuit structure of claim 6, wherein the first gate structure comprises a first gate dielectric layer and a first gate electrode, and wherein the second gate structure comprises a second gate dielectric layer and a second gate electrode.

8. The integrated circuit structure of claim 6, wherein the gate endcap isolation structure has a height greater than a height of the first gate structure and greater than a height of the second gate structure.

9. An integrated circuit structure, comprising:
a first semiconductor nanowire stack above an insulator substrate, the first semiconductor nanowire stack having a cut along a length of the first semiconductor nanowire stack, the first semiconductor nanowire stack having a width in a direction orthogonal to the length, and the first semiconductor nanowire stack having a bottommost surface, and the insulator substrate having an upper insulator portion;
a first gate structure around the first semiconductor nanowire stack, the first gate structure having a first gate electrode;
a second semiconductor nanowire stack above the insulator substrate, the second semiconductor nanowire stack having a cut along a length of the second semiconductor nanowire stack, the second semiconductor nanowire stack having a width in the direction different than the width of the first semiconductor nanowire stack, and the second semiconductor nanowire stack having a bottommost surface at a same level as the bottommost surface of the first semiconductor nanowire stack;
a second gate structure around the second semiconductor nanowire stack, the second gate structure having a second gate electrode; and
a gate endcap isolation structure on and in direct physical contact with an uppermost surface of the upper insulator portion of the insulator substrate, the gate endcap isolation structure between the first semiconductor nanowire stack and the second semiconductor nanowire stack, the gate endcap isolation structure having a substantially uniform width along the lengths of the first and second semiconductor nanowire stacks, wherein the gate endcap isolation structure has an uppermost surface above an uppermost surface of the first gate electrode and the second gate electrode, and wherein the gate endcap isolation structure comprises a lower dielectric portion and a dielectric cap on the lower portion, the dielectric cap having a bottommost surface below an uppermost surface of the first semiconductor nanowire stack and an uppermost surface of the second semiconductor nanowire stack.

* * * * *